United States Patent
Iizuka et al.

(10) Patent No.: US 10,483,088 B2
(45) Date of Patent: Nov. 19, 2019

(54) MULTI CHARGED PARTICLE BEAM WRITING APPARATUS AND MULTI CHARGED PARTICLE BEAM WRITING METHOD

(71) Applicant: NuFlare Technology, Inc., Yokohama-shi (JP)

(72) Inventors: Osamu Iizuka, Yokohama (JP); Yukitaka Shimizu, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 93 days.

(21) Appl. No.: 15/806,576

(22) Filed: Nov. 8, 2017

(65) Prior Publication Data
US 2018/0138013 A1    May 17, 2018

(30) Foreign Application Priority Data

Nov. 11, 2016 (JP) ................. 2016-220802

(51) Int. Cl.
  *H01J 37/00*  (2006.01)
  *H01J 37/317* (2006.01)
  (Continued)

(52) U.S. Cl.
  CPC ........ *H01J 37/3177* (2013.01); *H01J 37/045* (2013.01); *H01J 37/147* (2013.01);
  (Continued)

(58) Field of Classification Search
  CPC ...... H01J 37/3177; H01J 37/20; H01J 37/244; H01J 37/3023; H01J 37/045; H01J 37/147;
  (Continued)

(56) References Cited

U.S. PATENT DOCUMENTS

| 7,034,321 B2* | 4/2006 | Takakuwa | B82Y 10/00 250/397 |
| 9,082,588 B2* | 7/2015 | Matsumoto | H01J 37/3177 |
| (Continued) | | | |

FOREIGN PATENT DOCUMENTS

| CN | 1820346 A | 8/2006 |
| JP | 10-261566 A | 9/1998 |
| (Continued) | | |

OTHER PUBLICATIONS

Combined Office Action and Search Report dated Apr. 17, 2018 in Taiwanese Patent Application No. 106134326 (with English translation of categories of cited documents), 6 pages.
(Continued)

*Primary Examiner* — Michael Maskell
(74) *Attorney, Agent, or Firm* — Oblon, McClelland, Maier & Neustadt, L.L.P.

(57) ABSTRACT

In one embodiment, a multi charged particle beam writing apparatus includes an aperture plate forming multiple beams, a stage on which a writing target substrate is placed, a stage position detector detecting the position of the stage, an inspection aperture plate provided in the stage, the inspection aperture plate permitting one of the multiple beams to pass through the inspection aperture plate, a deflector deflecting the multiple beams, a current detector detecting a beam current of each of the multiple beams scanned over the inspection aperture plate in X and Y directions and passed through the inspection aperture plate, and a control computer generating a beam image based on the detected beam currents and calculating positions of the beams based on the beam image and the position of the stage.

14 Claims, 8 Drawing Sheets

(51) Int. Cl.
 *H01J 37/04* (2006.01)
 *H01J 37/147* (2006.01)
 *H01J 37/20* (2006.01)
 *H01J 37/244* (2006.01)
 *H01J 37/302* (2006.01)
 *H01J 37/304* (2006.01)

(52) U.S. Cl.
 CPC .......... *H01J 37/20* (2013.01); *H01J 37/244* (2013.01); *H01J 37/304* (2013.01); *H01J 37/3023* (2013.01); *H01J 2237/0435* (2013.01); *H01J 2237/0453* (2013.01); *H01J 2237/24542* (2013.01); *H01J 2237/24564* (2013.01); *H01J 2237/24578* (2013.01); *H01J 2237/24592* (2013.01); *H01J 2237/3045* (2013.01); *H01J 2237/31774* (2013.01); *H01J 2237/31798* (2013.01)

(58) Field of Classification Search
 CPC ....... H01J 2237/0435; H01J 2237/0453; H01J 2237/24564; H01J 2237/24592; H01J 2237/31774; H01J 2237/31798
 USPC ............ 250/306, 307, 310, 311, 396 R–398
 See application file for complete search history.

(56) References Cited

U.S. PATENT DOCUMENTS

| | | | | |
|---|---|---|---|---|
| 2004/0135102 | A1* | 7/2004 | Muraki | B82Y 10/00 250/492.22 |
| 2014/0065547 | A1* | 3/2014 | Arita | H01J 37/3177 430/296 |
| 2016/0086764 | A1 | 3/2016 | Iizuka et al. | |

FOREIGN PATENT DOCUMENTS

| | | |
|---|---|---|
| JP | 2002-170767 | 6/2002 |
| JP | 2006-79911 A | 3/2006 |
| JP | 2006-210455 | 8/2006 |
| JP | 2008-41890 | 2/2008 |
| JP | 2016-134486 | 7/2016 |
| KR | 10-2016-0125313 A | 10/2016 |
| TW | 201339743 A | 10/2013 |

OTHER PUBLICATIONS

Office Action dated Mar. 15, 2019 in corresponding Korean Patent Application No. 10-2017-0144675 (with English Translation), 9 pages.

* cited by examiner

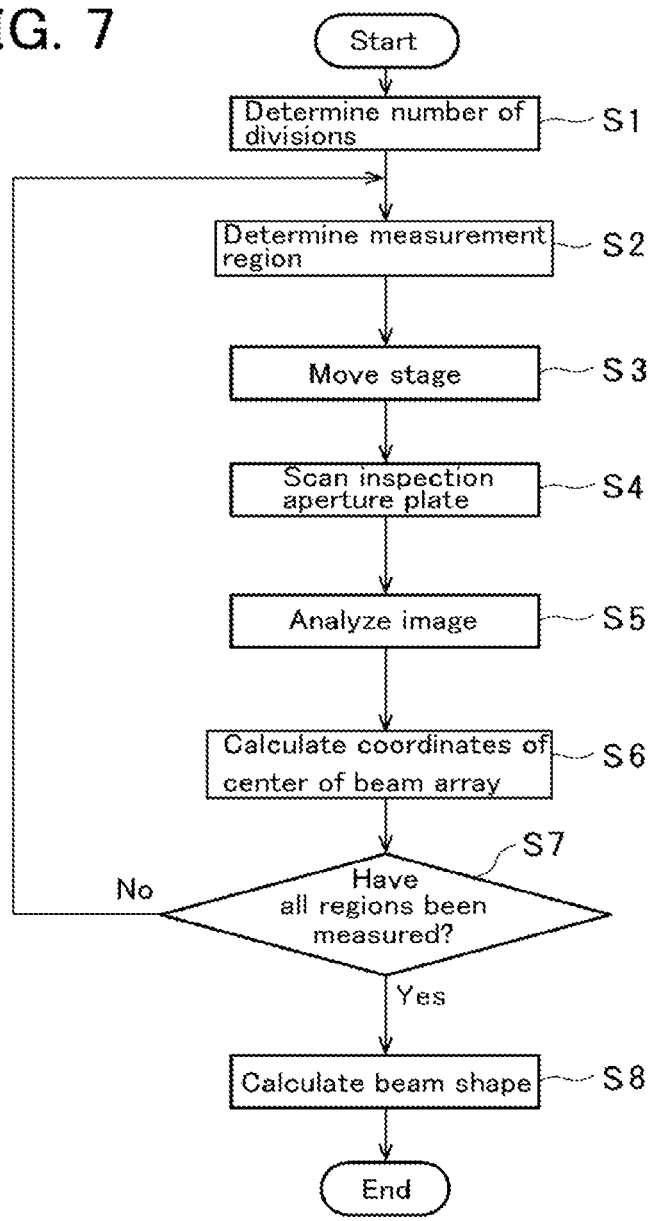

FIG. 8A
FIG. 8B
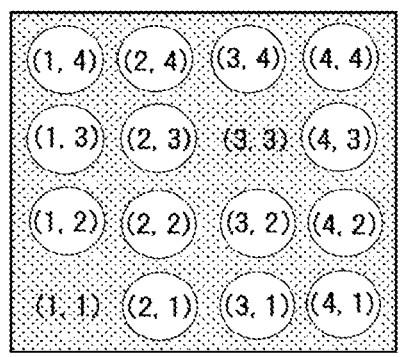
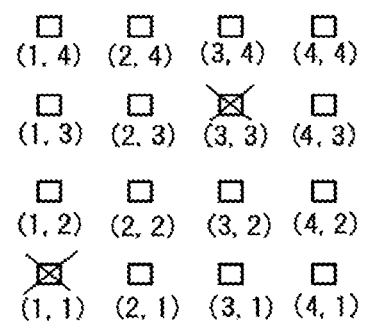
FIG. 9
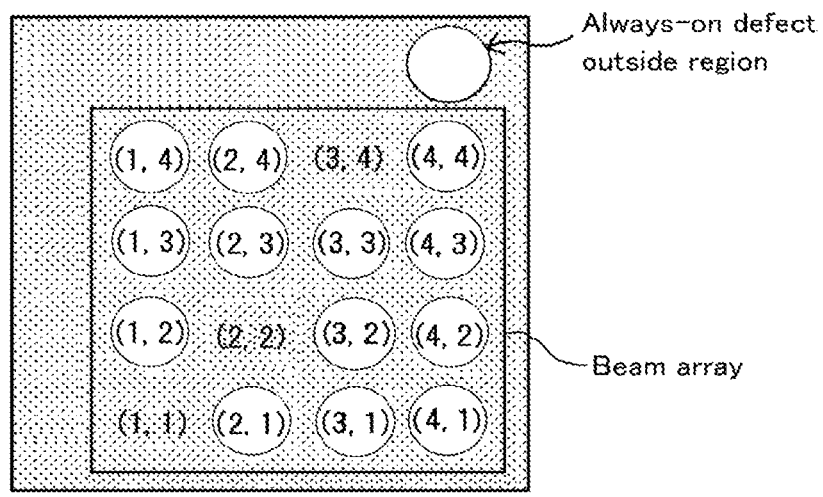

MULTI CHARGED PARTICLE BEAM WRITING APPARATUS AND MULTI CHARGED PARTICLE BEAM WRITING METHOD

CROSS REFERENCE TO RELATED APPLICATION

This application is based upon and claims benefit of priority from the Japanese Patent Application No. 2016-220802, filed on Nov. 11, 2016, the entire contents of which are incorporated herein by reference.

FIELD

The present invention relates to a multi charged particle beam writing apparatus and a multi charged particle beam writing method.

BACKGROUND

As LSI circuits are increasing in density, the line width of circuits of semiconductor devices is becoming finer. Examples of methods of producing an exposure mask (also called a reticle that is used in a stepper or a scanner) to be used to form a circuit pattern for such a semiconductor device include an electron beam writing technique with high resolution.

As an electron beam writing apparatus, a writing apparatus using multiple beams has been developed as a replacement for an existing single beam writing apparatus that deflects one beam and irradiates a necessary location on a substrate with the beam. By using multiple beams, irradiation is possible with more beams than in the case where writing is performed using one electron beam, thus resulting in a significantly improved throughput. In a multi-beam writing apparatus, for example, an electron beam emitted from an electron gun is caused to pass through an aperture member having a plurality of holes to form multiple beams, blanking control is performed on each beam at a blanking aperture array, a beam that is not blocked is reduced using an optical system, and a substrate placed on a movable stage is irradiated with the beam.

In such a multi-beam writing apparatus, multiple beams are applied simultaneously to an aperture member, the beams pass through the same or different apertures of the aperture member to form beams, and the formed beams are connected, thus forming a figure pattern having a desired shape. The shape of an entire image of multiple beams (hereinafter, also referred to as "beam shape") applied to a substrate represents the connection accuracy of a written figure. It is therefore important to compensate for distortion of the entire image of multiple beams.

To compensate for distortion of the entire image of multiple beams, the beam shape has to be measured accurately. Typically, the beam shape is measured by sequentially switching beams to a beam ON state, scanning each beam over a reflection mark on a stage to detect reflected electrons, and calculating the positions of the beams.

In scanning over the reflection mark on the stage, however, the amount of beam deflection by a deflector may increase and the trajectory of a beam may change accordingly, causing distortion of the beam shape. This distortion leads to a reduction in accuracy of beam position measurement.

The number of multiple beams is large (for example, approximately, 260,000 beams). It is therefore extremely difficult to fabricate an aperture member for forming multiple beams and a blanking aperture array member for performing blanking control on beams such that the members have no defects. In some cases, a defect of the aperture member or the blanking aperture array member causes an unintended beam to reach a substrate or causes a necessary beam to be interrupted, or prevented from reaching the substrate. It is difficult to eliminate effects of such a defect on the accuracy of beam position measurement in the typical method including scanning over a reflection mark. There is a need for a new method of accurately measuring the positions of beams.

BRIEF DESCRIPTION OF THE DRAWINGS

FIG. 7 is a flowchart depicting a beam position measuring method according to the embodiment;

FIG. 8A is a diagram illustrating an exemplary image obtained by beam scanning and FIG. 8B is a diagram illustrating an example of beam losses;

FIG. 9 is a diagram illustrating an example of beam array identification processing;

DETAILED DESCRIPTION

In one embodiment, a multi charged particle beam writing apparatus includes an aperture plate including a plurality of apertures through which a charged particle beam passes to form multiple beams, a blanking aperture array including a plurality of blankers each switching a corresponding one of the multiple beams between a beam ON state and a beam OFF state, a movable stage on which a writing target substrate is placed, a stage position detector detecting the position of the stage, an inspection aperture plate provided in the stage, the inspection aperture plate permitting one of the multiple beams to pass through the inspection aperture plate, a deflector deflecting the multiple beams, a current detector detecting a beam current of each of the multiple beams scanned over the inspection aperture plate in X and Y directions and passed through the inspection aperture plate, and a control computer generating a beam image based on the detected beam currents and calculating positions of the beams based on the beam image and the position of the stage.

Embodiments of the present invention will be described with reference to the drawings.

Figure 1:
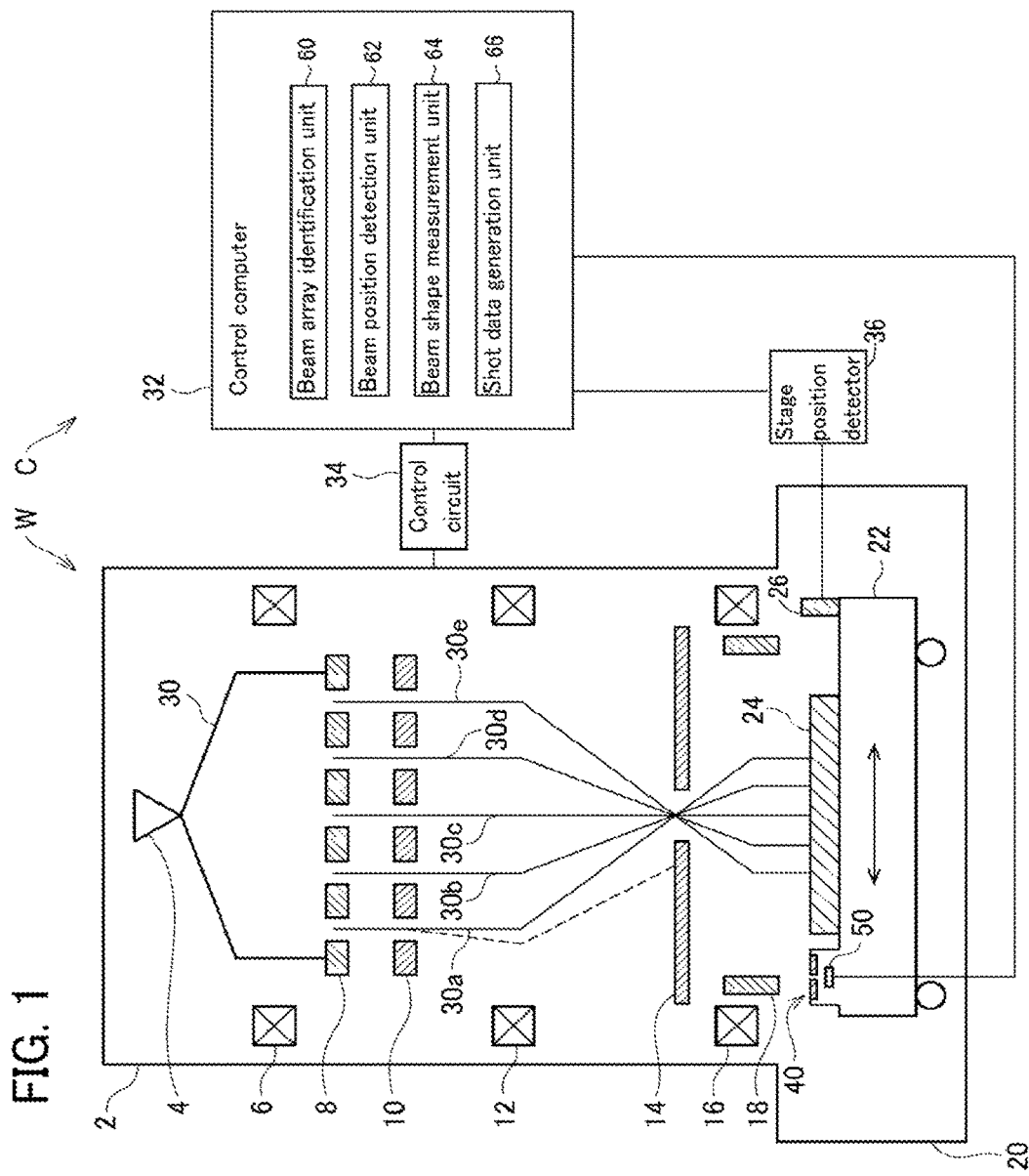
FIG. 1 is a schematic diagram of a multi charged particle beam writing apparatus according to an embodiment of the present invention.

FIG. 1 is a schematic diagram of a multi charged particle beam writing apparatus according to an embodiment of the present invention. The present embodiment will describe a configuration that uses an electron beam as a charged particle beam. Note, however, that the charged particle beam is not limited to an electron beam, and may be another beam using charged particles, such as an ion beam.

This writing apparatus includes a writing unit W that applies electron beams to a writing target substrate 24 to write a desired pattern on the substrate and a control unit C that controls an operation of the writing unit W.

The writing unit W includes an electron beam optical column 2 and a writing chamber 20. The electron beam optical column 2 accommodates an electron gun 4, an illumination lens 6, an aperture member 8 (an aperture plate), a blanking aperture array member 10, a reduction lens 12, a limiting aperture member 14, an objective lens 16, and a deflector 18.

The writing chamber 20 accommodates an XY stage 22. The writing target substrate 24 is placed on the XY stage 22. Examples of the writing target substrate 24 include a wafer and an exposure mask that is used to transfer a pattern to a wafer with a reduction projection exposure apparatus or an extreme ultraviolet (EUV) exposure apparatus, such as a stepper or a scanner, including an excimer laser as a light source.

A mirror 26 for measuring the position of the XY stage 22 is disposed on the XY stage 22. In addition, a multi-beam inspection device including a multi-beam inspection aperture member 40 (hereinafter, referred to as an "inspection aperture member 40") and a current detector 50 is disposed at a position in the XY stage 22 different from a position at which the substrate 24 is placed. The inspection aperture member 40 (inspection aperture plate) can be adjusted in level by an adjustment mechanism (not illustrated). Preferably, the inspection aperture member 40 is installed at the same level as the substrate 24.

Figure 2:
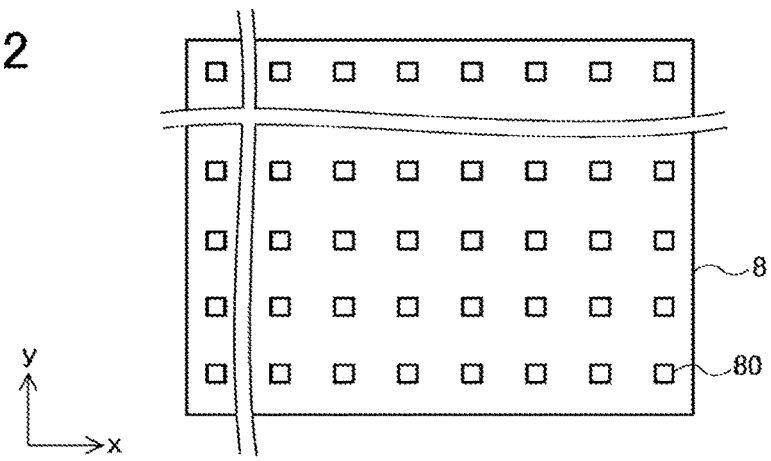
FIG. 2 is a schematic diagram of an aperture member.

The electron gun 4 emits an electron beam 30. The illumination lens 6 causes the electron beam 30 to be applied substantially perpendicular to the entire aperture member 8. FIG. 2 is a schematic diagram illustrating an exemplary configuration of the aperture member 8. The aperture member 8 has apertures (openings) 80 arranged in a matrix of m columns extending in a longitudinal direction (y direction) of the member×n rows extending in a lateral direction (x direction) thereof (m, n≥2) at a predetermined pitch. For example, the aperture member 80 has the apertures 80 arranged in a matrix of 512 columns×512 rows. The apertures 80 are rectangular and have the same dimensions. The apertures 80 may be circular and have the same diameter.

The electron beam 30 is applied to an area including all of the apertures 80 of the aperture member 8. The electron beam 30 partially passes through these apertures 80, thus forming multiple beams 30a to 30e as illustrated in FIG. 1.

Although FIG. 2 illustrates an example of arrangement of the apertures 80 in which the number of columns in the longitudinal direction (y direction) and the number of rows in the lateral direction (x direction) are two or more, the arrangement is not limited to this example. For example, one of the number of columns in the longitudinal direction (y direction) and the number of rows in the lateral direction (x direction) may be two or more and the other one of the number of columns and the number of rows may be one.

The blanking aperture array member 10 has through-holes respectively aligned with the apertures 80 of the aperture member 8. In each through-hole, a blanker including two electrodes paired is disposed. Each of the electron beams 30a to 30e passing through the through-holes can be independently deflected by a voltage applied by the blanker. This deflection achieves blanking control on the beams. The blanking aperture array member 10 performs blanking deflection on each of the multiple beams passed through the apertures 80 of the aperture member 8.

The multiple beams 30a to 30e passed through the blanking aperture array member 10 are reduced in size and arrangement pitch by the reduction lens 12 and travel toward a central aperture of the limiting aperture member 14. Electron beams deflected by the blankers of the blanking aperture array member 10 change their trajectories, so that the electron beams are deviated from the central aperture of the limiting aperture member 14 and are accordingly interrupted by the limiting aperture member 14. In contrast, electron beams that have not been deflected by the blankers of the blanking aperture array member 10 pass through the central aperture of the limiting aperture member 14.

The limiting aperture member 14 interrupts electron beams deflected in a beam OFF state by the blankers of the blanking aperture array member 10. The beams passed through the limiting aperture member 14 for a period between the time when the beams enter a beam ON state and the time when the beams are changed to the beam OFF state correspond to a one-time electron beam shot.

The electron beams 30a to 30e passed through the limiting aperture member 14 are focused by the objective lens 16, thus forming a pattern image reduced at a desired reduction ratio on the substrate 24. The electron beams (multiple beams) passed through the limiting aperture member 14 are collectively deflected in the same direction by the deflector 18 and are then applied to the substrate 24.

While the XY stage 22 is continuously moved, the deflector 18 performs tracking control such that beam writing positions (irradiation positions) follow the movement of the XY stage 22. A stage position detector 36 emits laser light to the mirror 26 on the XY stage 22. Reflected light is used to measure the position of the XY stage 22.

The multiple beams applied at a time are ideally arranged at a pitch obtained by multiplying the arrangement pitch of the apertures 80 of the aperture member 8 by the above-described desired reduction ratio. The writing apparatus performs a writing operation in a raster scanning manner such that beam shots are successively and sequentially applied. To write a desired pattern, the blanking control causes beams necessary for the pattern to enter the beam ON state.

The control unit C includes a control computer 32 and a control circuit 34. The control computer 32 includes a beam array identification unit 60, a beam position detection unit 62, a beam shape measurement unit 64, and a shot data generation unit 66. These units of the control computer 32 may be implemented by hardware, such as electric circuitry, or software, such as a program that achieves functions of the units. If the units are implemented by software, a program that achieves the functions of the units may be stored in a recording medium and a computer including electric circuitry may be caused to read and execute the program.

The shot data generation unit 66 performs multi-stage data conversion on write data to generate shot data specific to the apparatus and outputs the generated data to the control circuit 34. In the shot data, for example, a dose for each shot and the coordinates of irradiation positions for the shot are defined. The control circuit 34 divides a dose for each shot by a current density to obtain irradiation time t. To perform each shot, the control circuit 34 applies a deflection voltage to blankers relevant to the shot in the blanking aperture array member 10 such that beams corresponding to the blankers are in the beam ON state only for the irradiation time t.

The control circuit 34 calculates the amount of deflection so that beams are deflected to positions (coordinates) indicated by the shot data, and applies a deflection voltage to the deflector 18. Consequently, the multiple beams to be applied in the shot are collectively deflected.

In this writing apparatus, many beams arranged at a pitch obtained by multiplying the arrangement pitch of the apertures 80 of the aperture member 8 by a predetermined reduction ratio are simultaneously applied to the writing target substrate 24, and the beams are connected to remove the beam pitch, thus writing a figure pattern having a desired shape. Before writing, it is necessary to detect the positions of beams, measure a beam shape, and compensate for distortion of the beam shape. The positions of the beams are detected using the multi-beam inspection device including the inspection aperture member 40 and the current detector 50.

Figure 3:
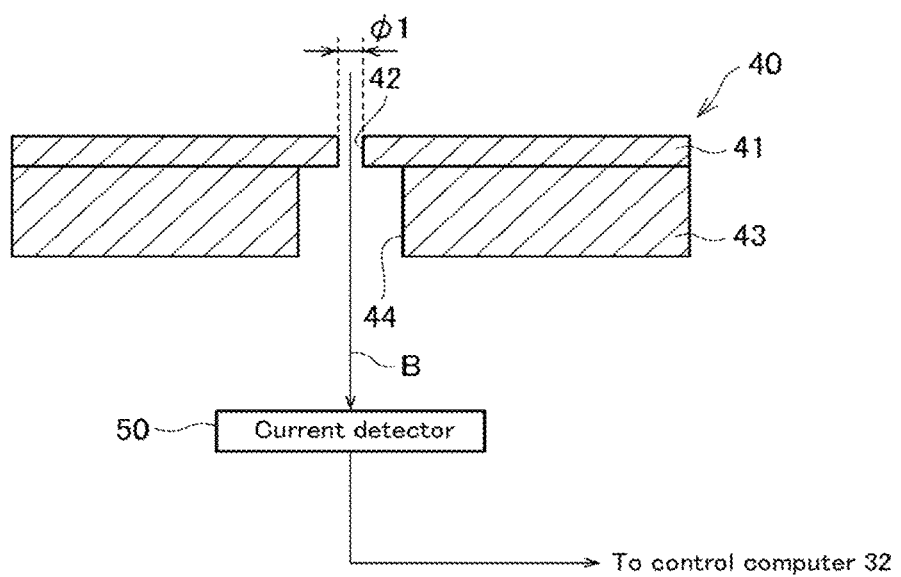
FIG. 3 is a schematic diagram of a beam inspection device according to the embodiment.
Figure 4:
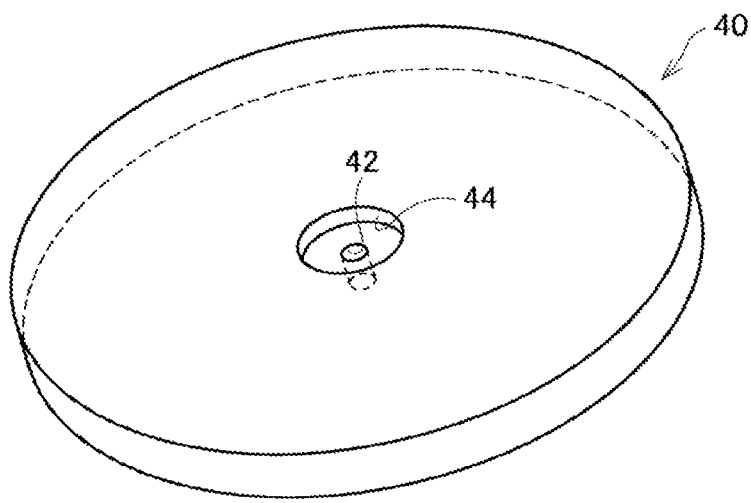
FIG. 4 is a perspective view of a multi-beam inspection aperture member according to the embodiment.
Figure 5:
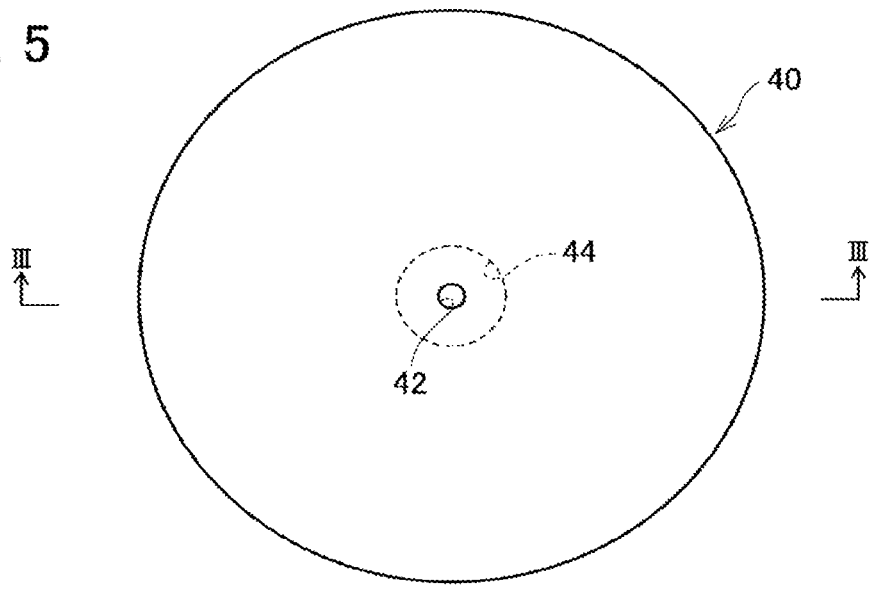
FIG. 5 is a plan view of the multi-beam inspection aperture member according to the embodiment.

An exemplary configuration of the multi-beam inspection device will now be described with reference to FIGS. 3 to 5. FIG. 3 is a schematic diagram illustrating the configuration of the multi-beam inspection device. FIG. 4 is a bottom perspective view of the inspection aperture member 40. FIG. 5 is a top plan view of the inspection aperture member 40. FIG. 3 illustrates a cross-section of the inspection aperture member 40 taken along the line III-III in FIG. 5.

The inspection aperture member 40 limits electron beams such that a single electron beam passes through the member. For example, an inspection aperture member including a scattering layer 41 and an absorbing layer 43 can be used. The scattering layer 41 is disposed on the absorbing layer 43. The inspection aperture member 40 has, for example, a circular flat surface, and further has a through-hole extending along the axis of the member. The through-hole includes an opening 44 disposed in central part of the absorbing layer 43 and a through-hole 42 disposed in central part of the scattering layer 41 and communicating with the opening 44.

To make the inspection aperture member 40, a thin film of heavy metal having high stopping power, such as Pt or W, is prepared. The thin film is etched using a focused ion beam (FIB), thus forming the opening 44 in a lower surface of the film. Then, the bottom of the opening 44 is etched using the FIB, thus forming the through-hole 42 having a smaller diameter than the opening 44. In the thin film of heavy metal, part through which the opening 44 extends corresponds to the absorbing layer 43 and part through which the through-hole 42 extends corresponds to the scattering layer 41. The order in which the opening and the through-hole are formed is not limited to the above-described order.

Preferably, the diameter, indicated at $\phi 1$, of the through-hole 42 is $S<\phi 1<P-S$ where P denotes the beam pitch of the multiple beams on the substrate 24 and S denotes the beam size (of one beam). A diameter $\phi 1$ greater than the beam size S allows the entire single electron beam to pass through the through-hole 42 (transmission without scattering), leading to an increase in S/N ratio. The diameter $\phi 1$ is preferably as large as possible so that a beam can be easily found and the through-hole is not blocked by foreign matter.

In contrast, a diameter $\phi 1$ less than P−S prevents (part of) two adjacent beams from simultaneously passing through the through-hole 42 during scanning of the multiple beams. The through-hole 42 therefore permits only one electron beam of the multiple beams to pass through the through-hole 42. For example, when an electron beam B1 passes through the through-hole 42 as illustrated in FIG. 6, electron beams B2 next to the electron beam B1 do not overlap the through-hole 42.

Figure 6:
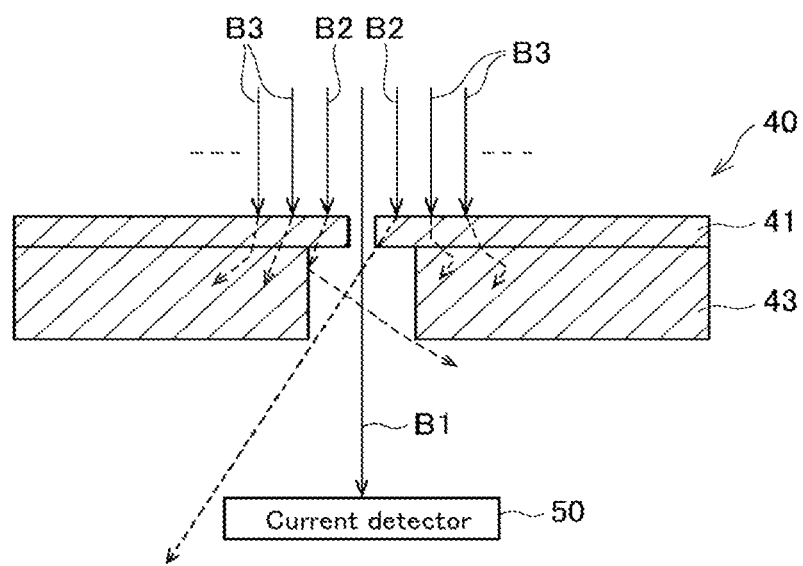
FIG. 6 is a diagram illustrating multiple beams applied to the inspection aperture member.

Referring to FIG. 6, when the electron beam B1 passes through the through-hole 42, the electron beams B2 (eight electron beams B2 surrounding the electron beam B1) next to the electron beam B1 are applied to the scattering layer 41. Although the electron beams B2 are partly reflected from the surface of the scattering layer 41, most of the electron beams B2 enter the scattering layer 41 and are scattered as indicated by dashed lines. The scattered electrons pass through the scattering layer 41. Some of the electrons travel straight in a vacuum, some of them are reflected from the surface of the absorbing layer 43, and some of them enter the absorbing layer 43, so that the electrons fail to or hardly reach the current detector 50. Electron beams B3 next but one or more to the electron beam B1 are scattered by the scattering layer 41. The scattered electrons enter the absorbing layer 43 and are absorbed by the absorbing layer 43.

The structure of the inspection aperture member 40 is not limited to the above-described example. Any member capable of limiting electron beams such that only one electron beam is allowed to pass through the member can be used.

The electron beam (an electron beam B in FIG. 3, the electron beam B1 in FIG. 6) passed through the through-hole 42 and the opening 44 is incident on the current detector 50, where a beam current is detected. Examples of the current detector 50 usable include a solid-state detector (SSD). Data indicating a detection result of the current detector 50 is sent to the control computer 32.

A method of measuring the positions of beams will now be described with reference to a flowchart of FIG. 7.

In the present embodiment, the blanking aperture array member 10 is divided into a plurality of measurement regions, beams corresponding to each measurement region are scanned over the inspection aperture member 40, and the positions of the beams are measured. In other words, the aperture member 8 is divided into a plurality of measurement regions, beams passed through the apertures 80 in the measurement regions are sequentially caused to enter the beam ON state, and the beams are scanned over the inspection aperture member 40.

The reason for the division of the blanking aperture array member 10 (aperture member 8) into the measurement regions is that a maximum amount of deflection by the deflector 18 used for beam scanning is not large enough to cover the entire area of the blanking aperture array member 10. If the deflection amount is large enough to cover the entire area of the blanking aperture array member 10, an increase in beam deflection amount would cause the trajectories of beams to change, distorting the beam shape. The distortion leads to a reduction in accuracy of beam position measurement. It is therefore preferred that the deflection amount for measurement be small enough to avoid distortion of the beam shape. For this reason, the number n (n is an integer of 2 or more) of regions into which the blanking aperture array member 10 is divided is first determined (step S1). If the amount of deflection by the deflector 18 is large enough to cover the entire area of the blanking aperture array member 10 and distortion of the beam shape caused by beam deflection is negligible in terms of measurement accuracy, the division into the measurement regions may be skipped.

A region that is not used for measurement is selected and determined as a measurement region (step S2). The XY stage 22 is moved and the inspection aperture member 40 is positioned directly below the beams corresponding to the measurement region (step S3).

For example, a voltage applied to the blankers in the measurement region is 0 V and a voltage applied to the blankers in the other regions (non-measurement regions) is 5 V. Multiple beams in the beam ON state provided by the blankers in the measurement region are deflected in the X and Y directions by the deflector 18 such that the beams are scanned over the inspection aperture member 40, thus sequentially allowing the electron beams to pass through the through-hole 42 (step S4). The current detector 50 detects a current of each beam.

The control computer 32 converts beam currents detected by the current detector 50 into intensities, generates a beam image based on the amounts of deflection by the deflector 18, and analyzes the image (step S5). For example, a beam image is generated as illustrated in FIG. 8A, which depicts an example of an image of an inspection region including lower left coordinates (1, 1) and a 4×4 beam array.

It can be seen from this image that there are beam losses at (1, 1) and (3, 3), as illustrated in FIG. 8B.

If an always-on defective beam exists in the vicinity of a measurement region, an image illustrated in FIG. 9 will be obtained. The beam array identification unit 60 identifies a beam array region corresponding to the measurement region. Such a defect outside the region is ignored. For example, since it is previously determined that the measurement region includes the 4×4 array, the beam array identification unit 60 identifies a beam array such that the number of beams included in the region having a size corresponding to the 4×4 array is maximized.

The beam position detection unit 62 detects the positions of the beams in the beam array region on the basis of the position of the stage detected by the stage position detector 36. Then, the beam position detection unit 62 calculates the coordinates of the center of the beam array corresponding to the measurement region on the basis of the positions of the beams (step S6).

Figure 10:
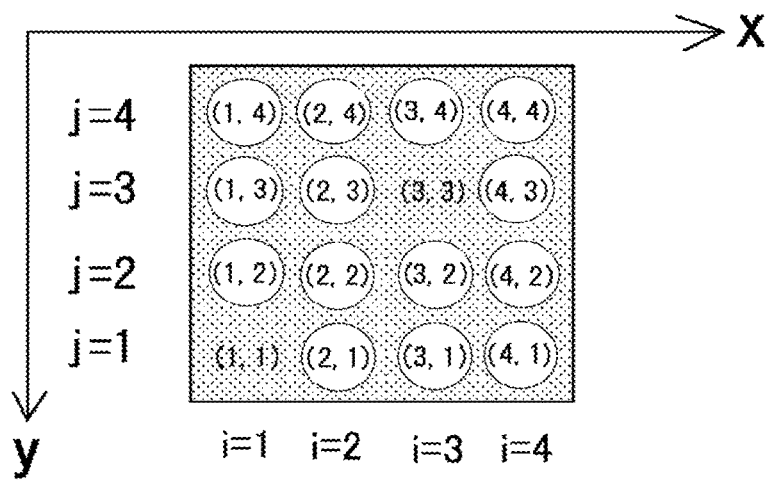
FIG. 10 is a diagram explaining how to obtain the coordinates of the center of a beam array.

For example, variables i and j are set as illustrated in FIG. 10. The x and y coordinates of beams are fit to the following expression, thus obtaining coefficients $a_0$, $a_1$, $a_2$, $b_0$, $b_1$, and $b_2$. Since beam losses are located at (1, 1) and (3, 3) in a case illustrated in FIG. 10, the x and y coordinates of the other beams are fit to the expression.

$$x_i = a_0 + a_1 i + a_2 j$$

$$y_j = b_0 + b_1 i + b_2 j$$

After the coefficients $a_0$, $a_1$, $a_2$, $b_0$, $b_1$, and $b_2$ are obtained, the coordinates of the center of the beam array are calculated using this expression. For the case of FIG. 10, substituting i=2.5 and j=2.5 into the expression yields the coordinates of the center of the beam array.

For the above-described expression, not only first order terms but also second order terms may be taken into account as follows.

$$x_i = a_0 + a_1 i + a_2 j + a_3 i^2 + a_4 ij + a_5 j^2$$

$$y_j = b_0 + b_1 i + b_2 j + b_3 i^2 + b_4 ij + b_5 j^2$$

Furthermore, higher order terms may be taken into account.

The above-described scanning over the inspection aperture member 40, image analysis, and calculation of the coordinates of the center of the beam array are performed for each of the n measurement regions of the blanking aperture array member 10 (steps S2 to S7).

Upon measurement for all of the measurement regions, the beam shape measurement unit 64 measures the beam shape based on the coordinates of the centers of the beam arrays corresponding to the respective measurement regions (step S8).

Figure 11:
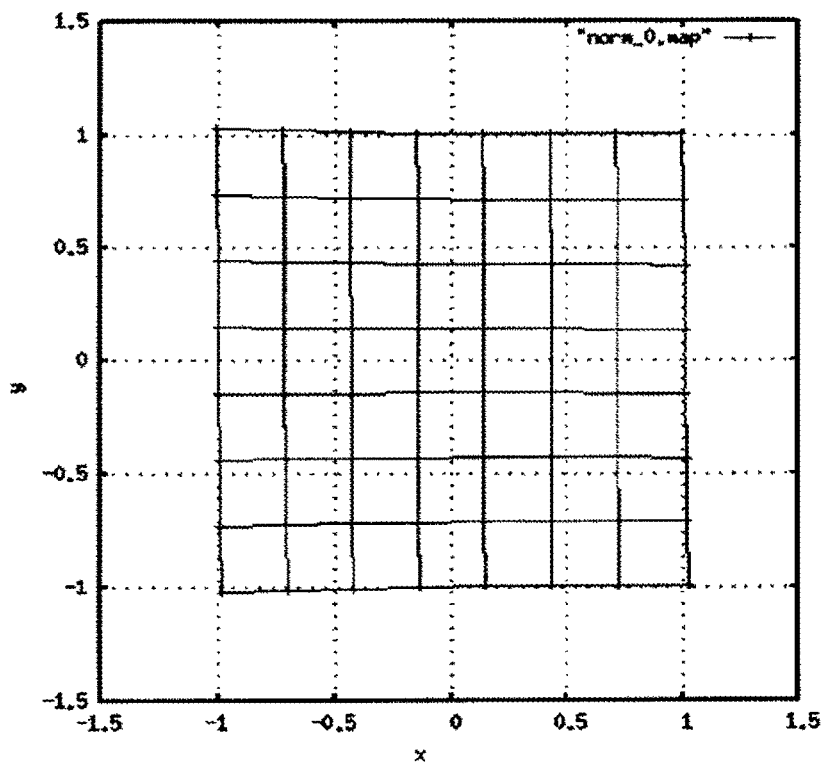
FIG. 11 is a diagram illustrating an example of a calculated beam shape.

For example, the beam shape measurement unit 64 fits the coordinates of the centers of the beam arrays corresponding to the n measurement regions to a third order polynomial, thus obtaining a polynomial representing the beam shape. Plotting this polynomial as a graph obtains a beam shape having slight distortion as illustrated in FIG. 11, for example. FIG. 11 illustrates the beam shape obtained by plotting deviations from an ideal lattice set in a range of −1≤x≤1 and −1≤y≤1 such that the beam shape is readily visually grasped.

The shot data generation unit 66 modulates a dose so as to compensate for the distortion of the beam shape and generates shot data.

As described above, according to the present embodiment, the blanking aperture array member 10 is divided into a plurality of measurement regions, and multiple beams corresponding to each measurement region are scanned over the inspection aperture member 40 such that the electron beams are sequentially allowed to pass through the through-hole 42, so that the positions of the electron beams can be detected in a short time. The coordinates of the center of a beam array corresponding to each of the measurement regions are obtained based on the positions of the beams, so that the beam shape can be measured.

In addition, the beam array is identified and a defect outside the beam array region is ignored. If a defective beam exists outside the beam array region as illustrated in FIG. 9, the positions of the beams can be detected without being affected by the defective beam.

Figure 12A:
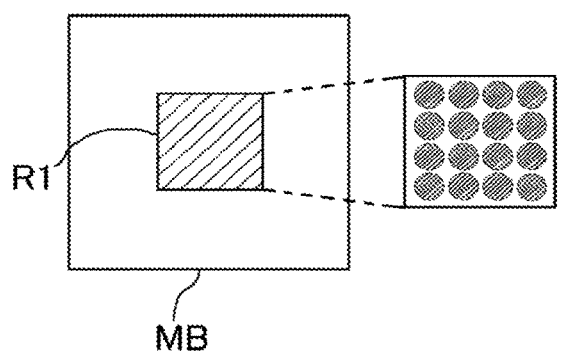
FIGS. 12A and 12B are diagrams illustrating examples of beam-ON regions.

The above embodiment has been described with reference to the case where, as illustrated in FIG. 12A, beams included in multiple beams MB and corresponding to a measurement region R1 are set to the beam ON state, the other beams corresponding to a non-measurement region are set to the beam OFF state, and the beams in the beam ON state are scanned over the inspection aperture member 40. The beams corresponding to the non-measurement region may be set to the beam ON state.

Figure 12B:
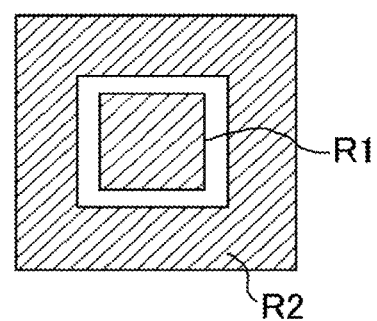

For example, as illustrated in FIG. 12B, not only the beams corresponding to the measurement region R1 but also beams corresponding to a non-measurement region R2 may be set to the beam ON state, and the beams corresponding to the measurement region R1 may be scanned over the inspection aperture member 40. Since the beams corresponding to the non-measurement region are in the beam ON state, the beams can be detected under conditions similar to those in actual writing, resulting in accurate measurement of the beam shape.

To identify a beam array, preferably, beams corresponding to a boundary portion that is included in the non-measurement region and that surrounds the measurement region R1 are set to the beam OFF state.

Although the above embodiment has been described with reference to the method of measuring a beam shape, deflection sensitivity of the deflector 18 can also be measured. For example, beams corresponding to a measurement region located at central part of the blanking aperture array member 10 are set to the beam ON state, the inspection aperture member 40 is moved to a position directly below the beams in the beam ON state, and the beams are scanned over the inspection aperture member 40, thus detecting the positions of the beams (the coordinates of the center of a beam array).

Then, the inspection aperture member 40 is moved to another position within a deflection region of the deflector 18, and the beams corresponding to the same measurement region are scanned over the inspection aperture member 40, thus detecting the positions of the beams. After that, the inspection aperture member 40 is moved to another different position and the positions of the beams are detected in a manner similar to the above. Assuming that the deflection region of the deflector 18 is, for example, rectangular, the inspection aperture member 40 is sequentially moved to the middle and four corners of the rectangular region such that the positions of the beams are detected at each of the middle and the four corners. The amounts of deflection by the deflector 18 are compared to the detected beam positions (the coordinates of the centers of the beam arrays), so that the deflection sensitivity can be measured.

If the deflector 18 having a two-stage configuration, or including a main deflector and a sub-deflector, main deflection sensitivity and sub-deflection sensitivity can be measured.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi charged particle beam writing apparatus comprising:
    an aperture plate including a plurality of apertures through which a charged particle beam passes to form multiple beams;
    a blanking aperture array including a plurality of blankers each switching a corresponding one of the multiple beams between a beam ON state and a beam OFF state;
    a movable stage on which a writing target substrate is placed;
    a stage position detector detecting the position of the stage;
    an inspection aperture plate provided in the stage, the inspection aperture plate permitting one of the multiple beams to pass through the inspection aperture plate;
    a deflector deflecting the multiple beams;
    a current detector detecting a beam current of each of the multiple beams scanned over the inspection aperture plate in X and Y directions and passed through the inspection aperture plate; and
    electric circuitry generating a beam image based on the detected beam currents and calculating positions of the beams based on the beam image and the position of the stage,
    wherein the inspection aperture plate includes a through hole through which the one of the multiple beams passes, and
    a diameter φ1 of the through hole satisfies a following condition:

$S<\phi1<P-S,$ wherein S is a beam size of the one of the multiple beams, and P is a beam pitch of the multiple beams on the writing target substrate.

2. The apparatus according to claim 1, wherein the blanking aperture array is divided into a plurality of measurement regions and scanning over the inspection aperture plate is performed for each of the measurement regions.

3. The apparatus according to claim 2, wherein the electric circuitry identifies a beam array region, corresponding to each of the measurement regions, in the beam image and calculates coordinates of the center of the beam array region.

4. The apparatus according to claim 3, wherein the electric circuitry calculates a shape of the multiple beams on the stage based on the coordinates of the centers of the beam array regions corresponding to the respective measurement regions.

5. The apparatus according to claim 2, wherein while beams corresponding to the measurement region are scanned over the inspection aperture plate, the blanking aperture array causes beams corresponding to a non-measurement region to enter the beam ON state.

6. The apparatus according to claim 5, wherein the blanking aperture array causes beams corresponding to a boundary portion that is included in the non-measurement region and that surrounds the measurement region to enter the beam OFF state.

7. The apparatus according to claim 1, wherein the inspection aperture plate is sequentially moved to a plurality of positions within a deflection region of the deflector, the multiple beams are scanned over the inspection aperture plate at each of the positions, and deflection sensitivity of the deflector is measured based on the calculated positions of the beams and amounts of deflection by the deflector.

8. A charged particle beam writing method comprising:
    emitting a charged particle beam;
    causing the charged particle beam to pass through a plurality of apertures in an aperture plate to form multiple beams;
    causing each of a plurality of blankers arranged in a blanking aperture array to switch a corresponding one of the multiple beams between a beam ON state and a beam OFF state;
    scanning the multiple beams over an inspection aperture plate in X and Y directions, the inspection aperture plate being provided in a stage on which a writing target substrate is placed, the inspection aperture plate permitting one of the multiple beams to pass through the inspection aperture plate;
    detecting a beam current of each of the multiple beams passed through the inspection aperture plate;
    generating a beam image based on the detected beam currents;
    detecting a position of the stage; and
    calculating positions of the beams based on the beam image and the position of the stage,
    wherein the inspection aperture plate includes a through hole through which the one of the multiple beams passes, and
    a diameter φ1 of the through hole satisfies a following condition:

$S<\phi1<P-S,$ wherein S is a beam size of the one of the multiple beams, and P is a beam pitch of the multiple beams on the writing target substrate.

9. The method according to claim 8, wherein the blanking aperture array is divided into a plurality of measurement regions and scanning over the inspection aperture plate is performed for each of the measurement regions.

10. The method according to claim 9, wherein a beam array region corresponding to each of the measurement regions in the beam image is identified and coordinates of the center of the beam array region is calculated.

11. The method according to claim 10, wherein a shape of the multiple beams on the stage is calculated based on the coordinates of the centers of the beam array regions corresponding to the respective measurement regions.

12. The method according to claim 9, wherein while beams corresponding to the measurement region are scanned over the inspection aperture plate, the blanking aperture array causes beams corresponding to a non-measurement region to enter the beam ON state.

13. The method according to claim 12, wherein the blanking aperture array causes beams corresponding to a boundary portion that is included in the non-measurement region and that surrounds the measurement region to enter the beam OFF state.

14. The method according to claim 8, wherein the inspection aperture plate is sequentially moved to a plurality of positions within a deflection region of a deflector, the multiple beams are scanned over the inspection aperture plate at each of the positions, and deflection sensitivity of the deflector is measured based on the calculated positions of the beams and amounts of deflection by the deflector.

* * * * *